United States Patent [19]

Charpentier et al.

[11] Patent Number: 4,489,284
[45] Date of Patent: Dec. 18, 1984

[54] OPERATIONAL AMPLIFIER CIRCUIT FOR NMOS CHIP

[76] Inventors: Albert J. Charpentier, 1945 Stewart Dr., Hatfield, Pa. 19440; James W. Redfield, 1697 Karen Dr., Pottstown, Pa. 19464

[21] Appl. No.: 455,048

[22] Filed: Jan. 3, 1983

[51] Int. Cl.$^3$ .............................................. H03F 3/16
[52] U.S. Cl. ..................................... 330/277; 330/291
[58] Field of Search ................ 330/85, 277, 291, 311; 307/279

[56] References Cited

U.S. PATENT DOCUMENTS 4,321,491  3/1982  Atherton et al. ............... 307/279 X Primary Examiner—James B. Mullins
Assistant Examiner—Steven J. Mottola
Attorney, Agent, or Firm—John J. Simkanich

[57] ABSTRACT

An operational amplifier circuit for use in high density L.S.I. chips incorporates four solid state silicon devices in a flip-flop-like configuration including a source follower function on the input side of the circuit while a depletion transistor provides for positive feedback and prohibits the circuit from latching thereby the circuit is locked to operate in a transition zone between switching states, providing a linear high gain function which can be operated as an amplifier.

6 Claims, 3 Drawing Figures

OPERATIONAL AMPLIFIER CIRCUIT FOR NMOS CHIP

BACKGROUND OF THE INVENTION

This invention relates generally to electronic circuits and specifically to amplifier circuits for use in solid state communications equipment whereby a small percentage of nonlinearity is tolerated but size is a critical factor.

Various manufacturers have sold various general purpose operational amplifiers for solid-state analog circuit operation. These circuits usually are concerned with low distortion, input sensitivity, rise time, slew rate and frequency and transient response characteristics, etc. over a relatively broad operational range.

While circuits can contain as many as twenty (20) silicon devices (transistors), they, more often, contain at least eight-to-ten (8-10) of them, as well as numerous resistors and diodes. When the operating requirements upon an operational amplifier are limited to a specific range and to limited space requirements, these prior art operational amplifiers provide too big and too costly a design choice.

What is desired is an operational amplifier which can be used in solid-state circuits such as those generating color signals for television in driving color guns and which take up and use a minimum amount of circuitry.

An object of this invention is to provide an operational amplifier which uses a minimum amount of circuitry.

A second object of this invention is to provide such an operational amplifier which exhibits less than 5% distortion when operated open loop over an output range of from 1.5 to 7.5 volts.

A further object of this invention is to provide such an amplifier which can be powered by a 12-volt supply and which is highly linear under closed loop circuit connection.

An even further object of this invention is to provide such an amplifier with a maximum output voltage range of 1 to 8 volts.

SUMMARY OF THE INVENTION

The objects of this invention are realized in an operational amplifier for use with solid-state circuits such as those used for television color gun drive circuitry, which amplifier is powered by the 12-volt supply commonly available to such circuitry.

A minimal number of field-effect-transistor (FET) type devices can be incorporated on a large scale integration (L.S.I.) chip to form the amplifier using a minimal amount of silicon area from the chip. The FET devices can be connected into a flip-flop (bistable multi-vibrator) like configuration and can be operated in the transition zone between what would otherwise be the two stable states of the flip-flop, to provide a relatively linear gain established about a "virtual ground."

A first FET device can provide a source follower function while a second FET device holds the output high to act as a load device. A third FET device can be implemented as a depletion device which inhibits the circuit from latching in a stable flip-flop state and is connected such that positive feedback is introduced into the circuit. A fourth FET device can complete the final amplifier stage to achieve as large a gain as possible, on the order of about 300 open loop.

DESCRIPTION OF THE DRAWINGS

The features, advantages and operation of the invention will be better understood from a reading of the following detailed description in connection with the accompanying drawings in which like numerals refer to like elements and in which.

DETAILED DESCRIPTION OF THE INVENTION

Figure 1:
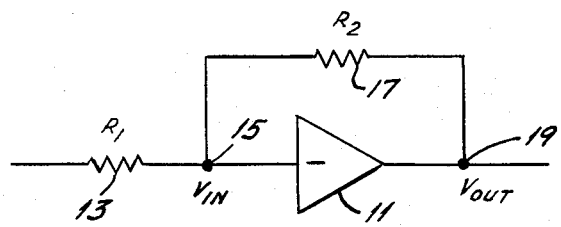
FIG. 1 is a general circuit connection for the operational amplifier of the invention.

The operational amplifier comprising the invention 11, FIG. 1, is intended to be operated in an analog circuit in a conventional inverting amplifier circuit connection. This conventional circuit connection includes an input resistor 13 connected in series to the input terminal 15 of the amplifier 11 and a feedback resistor 17 connected across the amplifier 11 from its output terminal 19 to its input terminal 15.

Figure 2:
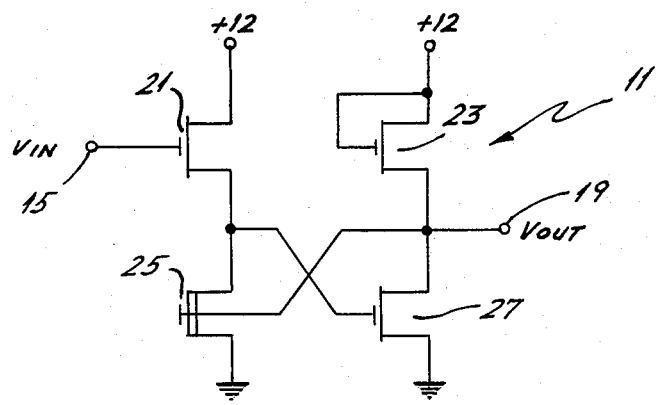
FIG. 2 is the circuit representation for the operational amplifier.

This amplifier 11 is implemented by a plurality of silicon devices such as the field effect transistor (FET) devices 21, 23, 25 and 27 shown in FIG. 2. These FETs 21, 23, 25, 27 are constructed in NMOS depletion load technology on a large scale integrated (L.S.I.) chip.

The first field effect transistor 21 has its gate pin connected to the input terminal 15 of the amplifier circuit 11. The drain pin of this first field effect transistor 21 is connected to a +12 volt power supply while the source pin of this field effect transistor 21 is connected to the drain pin of the third field effect transistor 25.

The gate pin and drain pin of the second field effect transistor 23 are connected together and connected to the +12 volt supply. The source pin of this second field effect transistor 23 is connected to the drain pin of the fourth field effect transistor 27 as well as to the output terminal 19 of the amplifier 11.

The gate pin of the fourth field effect transistor 27 is connected to the common connection between the source pin of the first field effect transistor 21 and the drain pin of the third field effect transistor 25. The output terminal 19 is also connected to the gate pin of the third field effect transistor 25. The source pins of the third and fourth field effect transistors 25, 27 are each connected to the ground.

In operation, the first field effect transistor 21 acts as a source follower to provide a level-shift function to the virtual ground voltage range. The second field effect transistor 23 acts as a load device on the output stage of the circuit.

The connection between the source pin of the first field effect transistor 21 and the gate pin of the fourth field effect transistor 27 provides the high gain drive for the device while the connection between the drain pin of the fourth field effect transistor 27 and the gate pin of the third field effect transistor 25 provides a positive feedback connection to the third field effect transistor 25 thus increasing total gain. By choosing to implement the third field effect transistor 25 as a depletion device the circuit can never latch into a steady state because of the slight "drain" through the device.

The circuit 11 of the invention while structurally is a modification of the circuit interconnection for a flipflop or bistable multivibrator when structured out of transistors, its operation is drastically different. It is not capable of being latched to a "high" or "low" because of the transistor interconnections and is forced to operate in the essentially linear transition zone between a "high" and a "low."

Figure 3:
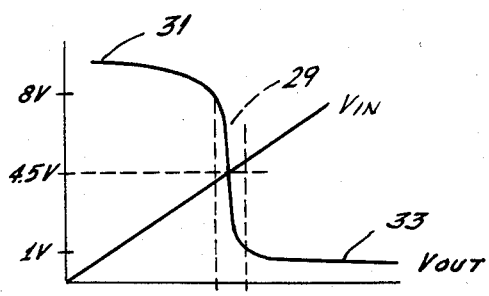
FIG. 3 is a transfer curve diagram for the operation of the invention.

FIG. 3 shows a typical transistion zone 29 between a "high" 31 state and a "low" 33 state for a flipflop operation. By limiting the operation of the amplifier 11 of the invention to the transition zone 29, the amplifier 11 exhibits essentially linear operation between a range of values of one volt to eight volts with a virtual ground being established at approximately 4.5 volts.

The benefit seen by using such an amplifier 11 is a significant savings in silicon area as it takes very few devices to implement. When powered with the 12 volt supply the amplifier 11 exhibits an open load gain of approximately 300 where virtual ground, i.e. V in=V out, is 4.5 volts. The amplifier is highly linear when operated in closed loop connection with a gain of 3 or less, and V out is in the range of 1 to 8 volts.

While the amplifier 11 is intended to be implemented with LSI circuitry, it can also be implemented with discrete components such as those available from Texas Instruments, Inc. of Dallas, Tex. When discrete components are used, N-channel silicon junction field effect transistors of the chip type "JN 60 series" can be used for the FET's 21, 23 and 27. The depletion type field effect transistor 25 can be implemented with an N-channel depletion type chip of the Texas Instruments MN 84 type; or could also be implemented with JFET's. As an alternative to the field effect transistors 21 and 27 enhancement connection a single N-channel enhancement field effect transistor pack, such as a Texas Instruments MN 83, can be used when implementing the circuit with discrete components.

In another alternative, various NPN transistors can be utilized when building the circuit of the invention out of discrete components.

It is intended that the above description be taken as illustrative and not in the limiting sense as a number of variations and modifications can be made to the invention without departing from the intent and scope thereof.

What is claimed is:

1. An operational amplifier circuit for high density LSI solid state circuits, having an input and output terminals, comprising:

first silicon circuit means for achieving a relatively high virtual ground level;

second silicon circuit means for amplifying said first silicon circuit means output, said second silicon circuit means being connected to said first silicon circuit means and to said output terminal;

third silicon circuit means for maintaining said second silicon circuit means output high, said third silicon circuit means being connected thereto; and fourth silicon circuit means being connected to said second silicon circuit means output and said first silicon circuit means output for providing a positive feedback path and for continuously conducting and thereby depleting the signal on said first silicon circuit output and prohibiting a latched state of said second and third silicon circuit means at said output terminal.

2. The circuit of claim 1 wherein said first and third silicon circuit means are paired in signal enhancement connection.

3. The circuit of claim 2 wherein said second silicon circuit means provides loading for said amplifier circuit.

4. The circuit of claim 3 wherein said third silicon circuit means includes a depletion type device.

5. The circuit of claim 4 wherein said first, second and fourth silicon circuit means comprise first, second and third silicon junction field effect transistors, respectively, each having gate, supply and drain pins, and wherein said third silicon circuit means comprises a depletion type field effect transistor, having gate supply and drain pins.

6. The circuit of claim 5 wherein the gate pin of said first junction field effect transistor is connected to the input terminal of said circuit; wherein the gate pin of said third junction field effect transistor is connected to the drain pin of said first junction field effect transistor; wherein the supply pin of said first and second junction field effect transistors is each connected to a voltage supply; and wherein the gate pin of said second junction field effect transistor is also connected to said voltage supply; wherein the drain pin of said second junction field effect transistor is connected in common to the output terminal of said circuit and to the gate pin of said depletion type field effect transistor; and wherein the drain pin of said depletion type field effect transistor and said third junction field effect transistor are each connected to ground.

* * * * *